(12) United States Patent
Takagi et al.

(10) Patent No.: US 6,419,993 B1
(45) Date of Patent: Jul. 16, 2002

(54) PRODUCTION PROCESS FOR MAGNETIC RECORDING MEDIUM

(75) Inventors: Kimie Takagi; Mikio Suzuki; Emi Shimaoka; Noriyuki Miyamoto, all of Chiba (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 09/537,560

(22) Filed: Mar. 30, 2000

Related U.S. Application Data
(60) Provisional application No. 60/147,015, filed on Aug. 3, 1999.

(30) Foreign Application Priority Data

Mar. 30, 1999 (JP) .............................. 11-088083

(51) Int. Cl.[7] .......................... C23C 16/50; H05H 1/24; B08B 9/08; C23F 1/00
(52) U.S. Cl. ....................... 427/534; 427/539; 427/577; 216/67; 134/1.1
(58) Field of Search ................................ 427/534, 539, 427/577, 530; 216/67; 134/1.1

(56) References Cited

U.S. PATENT DOCUMENTS

| 4,816,113 | A | | 3/1989 | Yamazaki .................... 156/643 |
| 5,176,791 | A | * | 1/1993 | Itoh et al. ..................... 134/1.1 |
| 5,356,478 | A | * | 10/1994 | Chen et al. ................... 134/1.1 |
| 5,981,000 | A | * | 11/1999 | Grill et al. ................... 427/577 |
| 6,077,572 | A | * | 6/2000 | Hopwood et al. .......... 427/577 |

OTHER PUBLICATIONS

English language abstract of JP 9279335 A Oct. 28, 1997, Mitsubishi Chem. Corp. Derwent.

* cited by examiner

Primary Examiner—Marianne Padgett
(74) Attorney, Agent, or Firm—Sughrue Mion, PLLC

(57) ABSTRACT

A production process for a magnetic recording medium comprising a non-magnetic substrate, a non-magnetic undercoat film, a magnetic film, and a protective film predominantly comprising carbon, which protective film is formed through a plasma CVD method by use of carbon-containing gas as a source and which process comprises applying an oxygen plasma to carbon deposits on the inner walls of a chamber or carbon present in the chamber for transformation.

8 Claims, 3 Drawing Sheets

PRODUCTION PROCESS FOR MAGNETIC RECORDING MEDIUM

CROSS REFERENCE TO RELATED APPLICATIONS

This application is an application filed under 35 U.S.C. §111(a) claiming benefit pursuant to 35 U.S.C. §119(e)(i) of the filing date of Provisional Application No. 60/147,015 filed Aug. 3, 1999 pursuant to 35 U.S.C. §111(b).

FIELD OF THE INVENTION

The present invention relates to a production process for a magnetic recording medium used in, for example, a hard disk apparatus.

BACKGROUND OF THE INVENTION

In recent years, recording density has been considerably increased in the field of magnetic recording, particularly in the case of recording in a hard disk apparatus. A variety of techniques are required for enhancing recording density. One example is a technique for controlling sliding characteristics between a magnetic head and a magnetic recording medium. With respect to magnetic recording media, a protective film formed on a magnetic film, a lubricant, etc. have been continuously developed and improved.

In order to increase recording density, spacing loss must be reduced. To this end, the flying height of a magnetic head is reduced, and therefore, wear resistance, sliding characteristics, and corrosion resistance of a surface of a magnetic recording medium are key factors for evaluating the reliability of the recording medium. In order to reduce such spacing loss, a thin protective film is desirable, having a thickness of, e.g., 100 Å or less. Thus, there is strong demand for a protective film which is thin and exhibits high toughness, to say nothing of smoothness.

A variety of materials have been proposed for a protective film of a magnetic recording medium. Of these, a protective film predominantly comprising carbon has been employed in consideration of overall characteristics, including film-formability, wear resistance, and sliding characteristics. The protective film predominantly comprising carbon is typically formed through sputtering. However, when a thin protective film; i.e., a protective film as thin as 100 Å or less, is produced through a conventional sputtering process, the film might have poor wear resistance and poor sliding characteristics.

In order to solve this problem, a plasma CVD method which can provide a protective film predominantly comprising carbon and having higher mechanical strength has been employed. Specific plasma CVD techniques are disclosed in Japanese Laid-Open Patent Application (Kokai) No. 7-73454 and Japanese Patent Publication (Kokoku) No. 7-21858.

When a protective film formed of carbon is produced on a substrate through a conventional plasma CVD method, a carbon film is also deposited on the interior walls of a chamber. When carbon film is exfoliated by, for example, due to stress, carbon dust is generated. If carbon dust is deposited on the carbon film, the surface smoothness of the carbon film is deteriorated, resulting in deterioration of a glide characteristic, which is one of the quality indices of a magnetic recording material; whereas if carbon dust is deposited on a substrate, an undercoat film or a magnetic film is exfoliated, to thereby result in a deterioration of an error characteristic, which is another one of the quality indices for a magnetic recording material. Carbon dust induces anomalous discharge during plasma generation, deteriorating the anti-corrosion characteristic of the formed protective film, to thereby deteriorate the quality of the produced magnetic recording medium. In addition, these defective products must be removed by inspection, and therefore, in mass production, the overall production yield decreases.

Furthermore, anomalous plasma discharge caused by carbon dust hampers constant operation of a film-forming apparatus.

Meanwhile, a conventional plasma CVD method requires interruption of operation and opening of the chamber of a film-forming apparatus in order to clean the chamber for removing carbon deposits. This results in disadvantageously low operation efficiency, in that not only is interruption of the apparatus required, but additional time is needed after cleaning is finished; specifically, for checking the quality of formed carbon film, which might be deteriorated due to exposure of the vacuum apparatus to air.

SUMMARY OF THE INVENTION

In view of the foregoing, the present invention provides a production process for a magnetic recording medium, which process solves the above problems.

The present inventors have conducted extensive studies, and have found that the above problems can be solved through application of oxygen plasma to transform carbon deposits on the inner walls of a chamber. The present invention has been accomplished on the basis of this finding.

Accordingly, a first embodiment of the present invention is directed to a production process for a magnetic recording medium having a non-magnetic substrate, a non-magnetic undercoat film, a magnetic film, and a protective film predominantly comprising carbon, the protective film being formed through a plasma CVD method employing a carbon-containing gas as a source, which process comprises applying an oxygen plasma to carbon deposits on the inner walls of a chamber or to carbon present in the chamber, for inducing conversion of carbon.

A second embodiment of the present invention is directed to a production process according to the first embodiment, wherein the pressure in the chamber during oxygen plasma discharge is at least about 3 Pa and less than about 150 Pa.

A third embodiment of the present invention is directed to a production process according to embodiments 1 or 2, wherein the amount of residual oxygen in a CVD chamber is decreased to a pressure of about $2.5 \times 10^{-3}$ Pa or less during the time between completion of oxygen plasma discharge and formation of another protective film.

A fourth embodiment of the present invention is directed to a production process according to embodiment 1, wherein, after completion of oxygen plasma discharge, residual oxygen in the chamber is substituted by a process gas.

A fifth embodiment of the present invention is directed to a production process according to the fourth embodiment, wherein substitution of the process gas for residual oxygen in the chamber is carried out for at least one second and less than five seconds.

A sixth embodiment of the present invention is directed to a production process according to any one of embodiments 1 to 5, wherein feed of oxygen gas is stopped before completion of oxygen plasma discharge, and the plasma discharge is maintained by pressure of residual oxygen in the chamber.

A seventh embodiment of the present invention is directed to a production process according to the sixth embodiment, wherein feed of oxygen gas is stopped about 0.5 to 2 seconds before completion of oxygen plasma discharge and the plasma discharge is maintained by pressure of residual oxygen in the chamber.

The application of oxygen plasma to carbon deposits on the inner walls of the chamber or to carbon present in the chamber for transformation will next be described. Oxygen plasma formed from fed oxygen gas comprises oxygen ions and oxygen radicals produced through excitation of oxygen molecules. After formation of a protective film predominantly comprising carbon, carbon is deposited on an exposed surface such as an electrode plate disposed on the inner walls of the chamber or a shield in the chamber. Flaking of the deposited carbon generates carbon dust. Oxygen ions or oxygen radicals collide with carbon deposits and carbon dust, to thereby form gases such as carbon monoxide and carbon dioxide, which gases are evacuated. Thus, carbon deposits on the inner walls of the chamber or carbon present in the chamber are removed. This mechanism has a cleaning effect and the process is advantageously operated such that residual oxygen is present where the oxygen plasma discharge is completed until the next cycle.

The above-described problems can be solved by means of the cleaning effect, with the result that a magnetic recording medium of high quality can be produced at high yield and a film-forming apparatus can be run at an improved operation rate.

DESCRIPTION OF THE PREFERRED EMBODIMENTS

Figure 1:
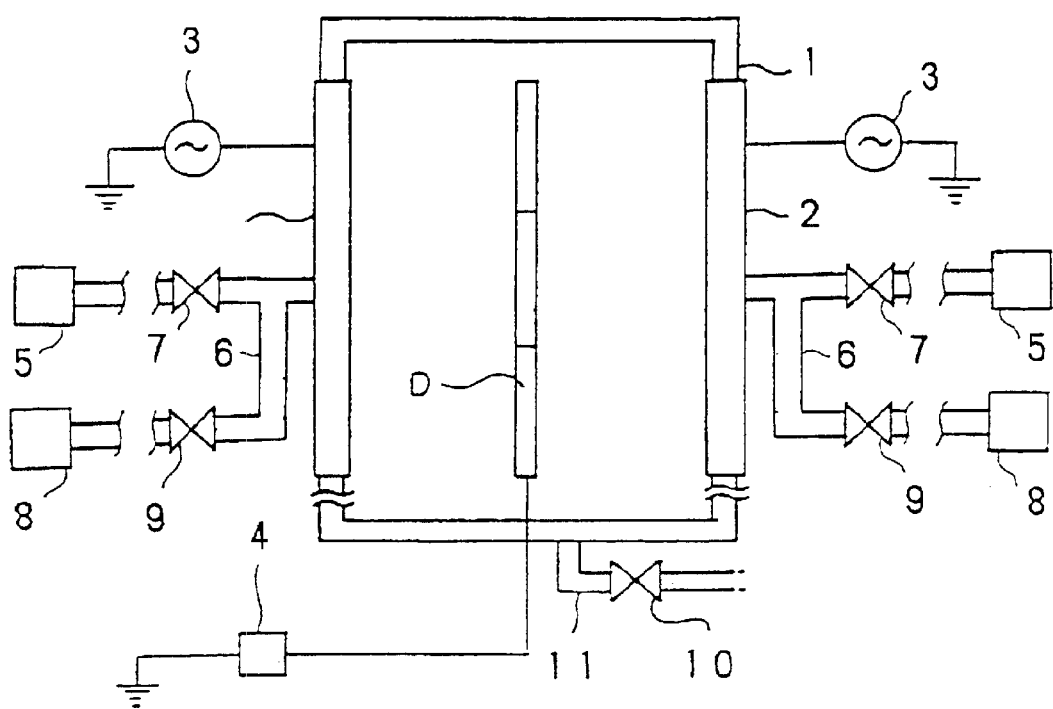
FIG. 1 is a schematic diagram showing a plasma CVD apparatus employed for carrying out one mode of the production process for a magnetic recording medium according to the present invention.

An embodiment for carrying out the present invention is described below. FIG. 1 is a schematic representation of a plasma CVD apparatus used for carrying out a mode of the production process for a magnetic recording medium according to the present invention. The apparatus comprises a chamber 1 accommodating a disk D on which a protective film predominantly comprising carbon is formed; electrodes 2 provided on opposing walls in the chamber 1 so as to face each other; high-frequency power sources 3 for supplying power to the electrodes 2; a bias power source 4 which may be connected to the disk in the chamber when the protective film predominantly comprising carbon is formed on the disk; process gas supply sources 5 for supplying a process gas serving as a raw material of the protective film predominantly comprising carbon, which film is formed on the disk; and oxygen gas supply sources 8 for supplying oxygen gas used for oxygen plasma discharge.

With respect to the above-described effect of oxygen plasma, the purity of oxygen gas is not particularly limited, but the purity is preferably 99.99% or more in order to avoid contamination in the chamber.

The chamber 1 is connected with conduits 6 for feeding process gas and oxygen gas from the sources, and an exhaust pipe 11 for discharging gas from the chamber. Each conduit comprises a process gas flow controlling valve 7 and an oxygen gas flow-controlling valve 9, and the valves may be controlled to thereby arbitrarily determine gas flow into the chamber. The exhaust pipe 11 comprises an exhaust valve 10, and the valve 10 may be controlled to thereby arbitrarily set the gas pressure in the chamber.

Figure 3:
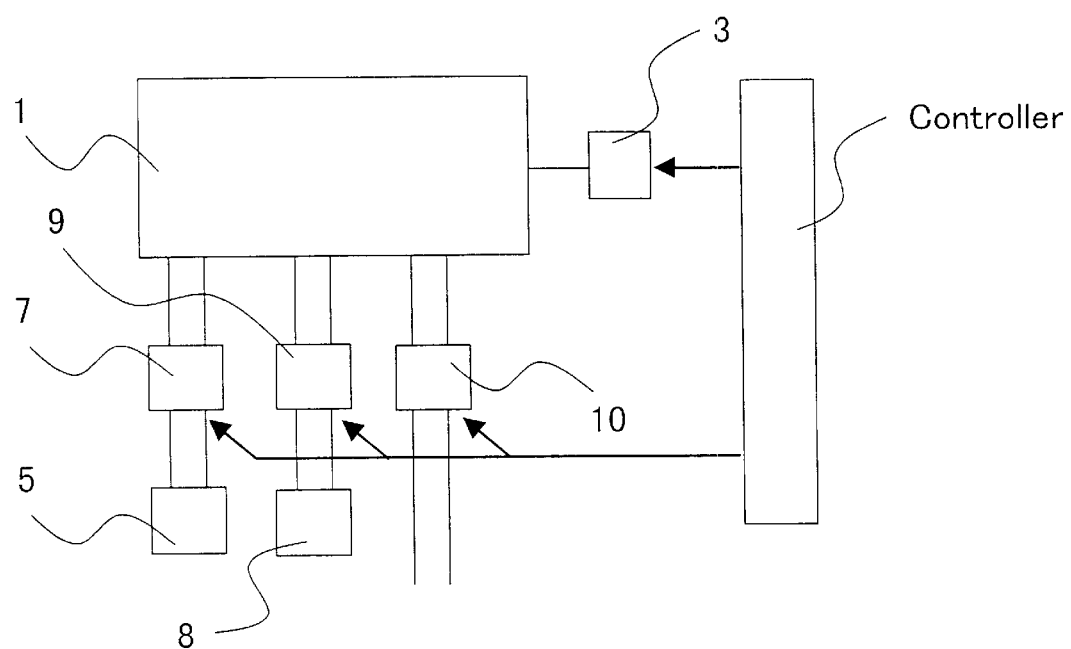
FIG. 3 is a block diagram showing a control system employed in one embodiment of a plasma CVD apparatus for forming a protective film, wherein a controller is connected to controlling valves via a power source.

These controlling valves are connected to a controller, which regulates the valves. More specifically, the controller regulates the timing of opening/closing and the degree of opening/closing of each valve in relation to the timing of initiation and/or completion of oxygen plasma discharge. FIG. 3 is a block diagram showing one example of the control system.

Preferred examples of the high-frequency power source 3 include a power source which can supply about 50 to 1000 W of power during the formation of the protective film predominantly comprising carbon and the discharge of oxygen plasma. The frequency of the power source 3 is not particularly specified in connection with the present invention, but, for example, a frequency of 13.56 MHz is preferable. A power source supplying power to the electrode during the formation of the protective film predominantly comprising carbon and another power source supplying power to the electrode during oxygen plasma discharge may be disposed independently.

An embodiment of the production process for a magnetic recording medium according to the present invention will next be described, taking the above-described apparatus as an example.

The disk D containing a magnetic layer is placed at a predetermined position in the chamber 1 using a conveyor (not shown in FIG. 1). After the protective film is formed on the disk, the resultant disk is removed from the chamber 1 using the conveyor. Then, carbon generated during the formation of the protective film is deposited on the inner walls or at other locations within the chamber. The carbon deposits may lead to the above-described drawbacks.

After the disk D is removed from the chamber 1, oxygen gas is fed into the chamber 1 via the conduits from the oxygen gas sources 8. After oxygen gas is fed, high-frequency energy is applied from the high-frequency power sources 3 to the electrodes, to thereby generate oxygen plasma. As a result of the above-described action, the carbon deposits inside the chamber may be removed, to thereby exhibit the cleaning effect.

The pressure of oxygen gas fed into the chamber and the power applied to the electrodes from the high-frequency power source are determined so that sufficient cleaning effect can be obtained by generated oxygen plasma.

The cleaning effect was evaluated according to the following procedure.

First, a small piece of Si wafer was affixed onto a portion of a magnetic recording medium on which a carbon film of 350 Å had been formed in advance, and the medium was mounted on a cathode, after which, oxygen plasma discharge was performed for five seconds. After completion of discharge, the medium was removed from the cathode, and the piece of Si wafer was peeled off. The portion covered with the piece had not been cleaned, leaving a step between the covered portion and the cleaned portion. The height of the step was measured by use of an atomic force microscope, and the etching rate of the carbon film achieved through the application of oxygen plasma is calculated, to thereby evaluate the cleaning effect. The results are shown in Table 1 below.

TABLE 1

|  | RF power (W) | Pressure in Chamber (Pa) | $O_2$ Flow (sccm) | Etching Rate (Å/sec) |
|---|---|---|---|---|
| Test Ex. 1 | 300 | 2 | 100 | not discharged |
| Test Ex. 2 | 300 | 5 | 100 | 18 |
| Test Ex. 3 | 300 | 10 | 100 | 25 |
| Test Ex. 4 | 300 | 10 | 300 | 25 |
| Test Ex. 5 | 300 | 10 | 800 | 26 |
| Test Ex. 6 | 500 | 10 | 300 | 40 |
| Test Ex. 7 | 500 | 10 | 500 | 43 |
| Test Ex. 8 | 500 | 20 | 500 | 78 |
| Test Ex. 9 | 500 | 50 | 500 | 119 |
| Test Ex. 10 | 500 | 100 | 500 | 130 |
| Test Ex. 11 | 500 | 140 | 500 | 137 |
| Test Ex. 12 | 500 | 160 | 500 | not discharged |
| Test Ex. 13 | 900 | 10 | 300 | 59 |
| Test Ex. 14 | 900 | 10 | 500 | 65 |

TABLE 1-continued

|  | RF power (W) | Pressure in Chamber (Pa) | $O_2$ Flow (sccm) | Etching Rate (Å/sec) |
|---|---|---|---|---|
| Test Ex. 15 | 900 | 20 | 500 | 88 |
| Test Ex. 16 | 900 | 50 | 500 | 134 |
| Test Ex. 17 | 900 | 100 | 500 | 145 |
| Test Ex. 18 | 900 | 140 | 500 | 147 |
| Test Ex. 19 | 900 | 160 | 500 | not discharged |

As is apparent from the results in Table 1, during oxygen plasma discharge, pressure in the chamber is preferably at least about 3 Pa and less than about 150 Pa, more preferably at least 20 Pa and less than 150 Pa, in order to stabilize discharge conditions and obtain a high etching rate.

As is also apparent from the results in Table 1, power from the high-frequency power source, which power is applied to the electrodes, is preferably at least about 300 W and about 900 W or less, more preferably at least 500 W and 900 W or less, in order to stabilize discharge conditions and obtain a high etching rate.

When the deposited carbon is sufficiently transformed, oxygen plasma discharge is stopped, and the next disc D on which the protective film is to be formed is placed in the chamber 1.

When a door (not shown in FIG. 1) between the chamber 1 and a waiting area (not shown in FIG. 1) containing the next disk is opened and the disk is placed at a predetermined position, if oxygen gas remains in the chamber and the gas conduits 6, the magnetic layer of the disk may be exposed to oxygen to thereby deteriorate the magnetic characteristics. Therefore, after cleaning of the chamber, the effect of residual oxygen gas in the chamber 1 and in the conduits 6 on the characteristics of a magnetic medium was investigated. The results are shown in Table 2 below.

TABLE 2

|  | Process Gas for Oxygen Substitution $C_4H_6/H_2$ (sccm) | Substitution Time (sec) | Coercive Force (Oe) | Raman Characteristics | | Amount of Residual Oxygen (Pa) |
|---|---|---|---|---|---|---|
|  |  |  |  | G-Line ($cm^{-1}$) | Id/Ig |  |
| Test Ex. 20 | 44/143 | 0 | 3008 | 1539.2 | 0.66 | 50 |
| Test Ex. 21 | 44/143 | 0.5 | 3382 | 1540.9 | 0.65 | $2.40 \times 10^{-3}$ |
| Test Ex. 22 | 44/143 | 1 | 3439 | 1541.6 | 0.61 | $1.55 \times 10^{-3}$ |
| Test Ex. 23 | 44/143 | 2 | 3432 | 1541.2 | 0.63 | $1.35 \times 10^{-3}$ |
| Test Ex. 24 | 44/143 | 3 | 3443 | 1542.7 | 0.66 | $1.40 \times 10^{-3}$ |
| Test Ex. 25 | 44/143 | 4 | 3440 | 1541.9 | 0.65 | $1.40 \times 10^{-3}$ |
| Test Ex. 26 | 20/0 | 0 | 2972 | 1539.8 | 0.62 | 48.5 |
| Test Ex. 27 | 20/0 | 1 | 3442 | 1540.7 | 0.62 | $1.65 \times 10^{-3}$ |
| Test Ex. 28 | 20/0 | 2 | 3428 | 1540.3 | 0.64 | $1.50 \times 10^{-3}$ |
| Test Ex. 29 | 20/0 | 3 | 3435 | 1541.2 | 0.63 | $1.40 \times 10^{-3}$ |
| Test Ex. 30 | 20/0 | 4 | 3431 | 1542.0 | 0.67 | $1.45 \times 10^{-3}$ |
| Test Ex. 31 | 0/143 | 0 | 2989 | 1540.0 | 0.60 | 49 |
| Test Ex. 32 | 0/143 | 1 | 3433 | 1541.5 | 0.62 | $1.45 \times 10^{-3}$ |
| Test Ex. 33 | 0/143 | 2 | 3430 | 1541.9 | 0.59 | $1.35 \times 10^{-3}$ |
| Test Ex. 34 | 0/143 | 3 | 3446 | 1541.7 | 0.64 | $1.25 \times 10^{-3}$ |
| Test Ex. 35 | 0/143 | 4 | 3441 | 1541.3 | 0.61 | $1.25 \times 10^{-3}$ |

The effect of residual oxygen on the characteristics of a magnetic medium was evaluated according to the following procedure.

A NiP-plated Al substrate was subjected to a texturing process to thereby attain a surface roughness (Ra) of 6 Å, and the thus-processed substrate was placed in a film-forming apparatus (Model 3010: product of ANELVA Corporation). The apparatus was evacuated to $2.0 \times 10^{-6}$ Pa, and a Cr alloy film and a Co alloy film were successively formed on the substrate, serving as an undercoat film and a magnetic film, respectively, to thereby obtain a disk.

Subsequently, a carbon film having a thickness of 50 Å was formed as a protective film on the magnetic film through plasma CVD employing a hydrocarbon-hydrogen mixture gas serving as a raw material. During formation of the carbon film, the temperature of the disk and the film-forming rate were 170° C. and 400 Å/min, respectively.

In this case, a magnetic layer of the above-produced disk was exposed to residual oxygen in the chamber, and the amount of the residual oxygen was measured by use of a quadrupole mass spectrometer connected to a differential discharge meter attached to a process chamber, which is disposed one step prior to the plasma CVD chamber.

Static magnetic characteristics of the disk were measured at points of 21.5 mm and 45 mm along the radius by use of a static magnetic characteristic measuring apparatus (Model RO01700: product of Hitachi Denshi Engineering) utilizing the Kerr effect.

As is apparent from the results in Table 2, during a time between completion of oxygen plasma discharge and formation of another protective film, when the amount of residual oxygen in the chamber is in excess of $2.5 \times 10^{-3}$ Pa, static magnetic characteristics deteriorate, and therefore the amount of residual oxygen is $2.5 \times 10^{-3}$ Pa or less, preferably $1.65 \times 10^{-3}$ Pa or less.

An example means for reducing residual oxygen in the chamber 1 is substitution of oxygen by process gas after completion of oxygen plasma discharge. For example, simultaneous with the completion of oxygen discharge, the oxygen gas flow-controlling valve 9 is closed, and the process gas flow-controlling valve 7 is opened to thereby supply process gas into the chamber.

In this case, in order to shorten the gas substitution time, residual oxygen in the chamber may be forcedly exhausted simultaneous with the completion of oxygen discharge. For example, the plasma CVD apparatus preferably has a function for controlling the degree of opening of the exhaust controlling valve 10 automatically within one second, from 15% (the degree of opening during oxygen plasma discharge) to 100%.

In order to prevent oxidation of the magnetic layer of the disk by residual oxygen, the change in coercive force was investigated in the case where residual oxygen gas in the chamber is substituted by process gas after completion of oxygen discharge. The results are shown in Table 2.

As is apparent from the results in Table 2, the time for substitution of a process gas for residual oxygen in the chamber is preferably about one second or longer and shorter than about five seconds. When the time is about one second or longer, residual oxygen may be suppressed to a predetermined amount or less; whereas when the time is about five seconds or longer, the process time becomes longer, resulting in poor productivity.

Another example of means for reducing residual oxygen in the chamber 1 is stopping oxygen gas supply before completion of oxygen plasma discharge, and maintaining the discharge by use of residual pressure of oxygen in chamber 1. For example, the gas flow-controlling valve 9 is closed after completion of oxygen plasma discharge.

The change in coercive force was investigated in the case where oxygen gas supply was stopped before completion of oxygen discharge in order to prevent oxidation of the magnetic layer of the disk by residual oxygen. The results are shown in Table 3 below.

TABLE 3

| | Time During Which Oxygen Gas Supply Is Stopped Before Completion of Discharge (sec) | Coercive Force (Oe) |
|---|---|---|
| Test Ex. 40 | 0 | 2933 |
| Test Ex. 41 | 0.5 | 3102 |
| Test Ex. 42 | 1 | 3118 |
| Test Ex. 43 | 2 | 3115 |

As is apparent from the results in Table 3, oxygen gas supply is preferably stopped 0.5 to 2 seconds before completion of oxygen plasma discharge, and the discharge is maintained by use of the pressure of residual oxygen in the chamber. When the time during which oxygen gas supply is stopped is shorter than 0.5 seconds, the amount of residual oxygen in the chamber is greater than a predetermined value; whereas when the time is longer than two seconds, the pressure in the chamber becomes very low and the discharge is not performed in a stable manner, which is unsatisfactory.

The above-described means for substituting residual oxygen in the chamber by process gas after completion of oxygen plasma discharge may be employed in combination with the means for stopping oxygen gas supply before completion of the discharge and maintaining the discharge by use of the pressure of residual oxygen in the chamber.

As is described above, the cleaning method utilizing carbon-transformation by the application of oxygen plasma may be performed arbitrarily in accordance with the numbers of protective films produced, in consideration of the carbon deposits to the inner walls of the chamber, the amount of carbon dust, and the overall production yield. If cleaning is performed on a basis of a disk-conveying carrier serving as one unit, process control may be facilitated.

EXAMPLES

Example production methods of the present invention will next be described specifically, which should not be construed as limiting the invention thereto. Unless otherwise indicated, all parts, percents, ratios and the like are by weight.

An NiP-plated Al substrate was subjected to a texturing process, to thereby attain a surface roughness (Ra) of 6 Å, and was placed in a film-forming apparatus (Model 3010, product of ANELVA Corporation). The apparatus was evacuated to a vacuum of $2.0 \times 10^{-6}$ Pa, and a Cr alloy film and Co alloy film were successively formed as an undercoat film and a magnetic film, respectively.

Furthermore, a carbon film having a thickness of 50 Å was formed as a protective film on the magnetic film through plasma CVD employing a hydrocarbon-hydrogen mixture gas as a carbon source. The temperature of the substrate (disk) and rate of film formation were 170° C. and 400 Å/minute, respectively. Through a dipping method, the carbon protective film was coated with FOMBLIN (trade name, fluorinated lubricant) to a thickness of 15 Å.

In the following manner, the quality of the resultant products was confirmed on the basis of stiction characteristics. First, a CSS test was carried out by use of an MR head at a rotation rate of 7200 rpm under the conditions of 40° C. and 80% humidity. CSS was carried out 20000 times, with each repetition of CSS comprising a cycle of increase for 5 seconds, high-speed operation for 1 second, decrease for 5 seconds, and parking for 1 second. Thereafter, the disk was allowed to remain stationary, and a dynamic stiction value was monitored at a similar increase time. The static magnetic characteristics of the sample were evaluated at points 21.5 mm and 45 mm along the radius by use of an apparatus (Model RO 1700, product of Hitachi Denshi Engineering), to thereby confirm the quality of the sample. The number of recording disks produced was 8000/day.

Cleaning by use of oxygen plasma was carried out after every two repetitions of protective film formation. The internal pressure of the chamber during oxygen plasma discharge was 20 Pa.

The exhaust controlling valve was adjusted so that the valve could be automatically opened from an opening degree (15%) during oxygen plasma discharge to an opening degree of 100% within one second. Cleaning by use of oxygen plasma was carried out under one of the following two conditions.

Condition (1): Residual oxygen was substituted by a process gas for 4 seconds after completion of oxygen plasma discharge.

Condition (2): Feed of oxygen gas was stopped 1 second before completion of oxygen plasma discharge, and oxygen plasma discharge was maintained through pressure of residual oxygen.

Figure 2:
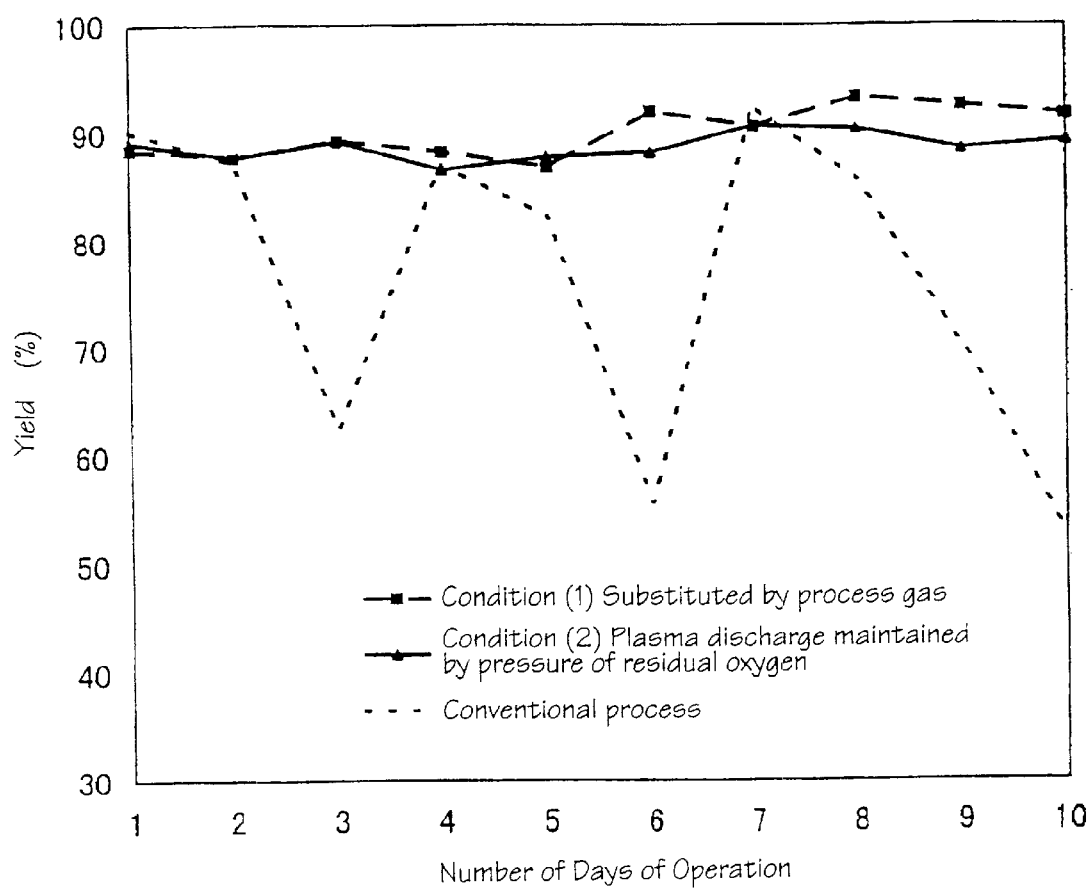
FIG. 2 is a graph showing the relationship between the number of days of operating a film-forming apparatus and production yield attained according to one embodiment of the production process for a magnetic recording apparatus according to the present invention, in comparison with the case in which a conventional production process is employed.

The production process according to the present invention was carried out under Conditions (1) and (2), and the relationship between the number of days for operating a film-forming apparatus and production yield is shown in FIG. 2, in comparison with the case in which a conventional production process, which does not involve a cleaning process using oxygen plasma, was employed.

In the conventional method, the chamber was opened so as to remove carbon deposits from the inner walls of the chamber or carbon dust contained in the chamber at the third and sixth days, when the production yield was observed to decrease. Since the production yield recovered after cleaning was performed, a predominant factor for decreasing yield (yield after a glide characteristic inspection×yield after an error inspection) is considered to be carbon deposits or carbon dust. In contrast, in the production process according to the present invention, the chamber was not opened for carrying out cleaning, and decrease in production yield was not observed under Conditions (1) and (2). Therefore, the process according to the present invention can maintain a high production yield without generating carbon deposits or carbon dust. After operation was terminated after 10 days, carbon deposits or carbon dust was observed in the chamber in the case of the conventional production process, whereas the status of carbon deposits or carbon dust at the initial stage of production remained unchanged in the case of the process according to the present invention, under Condition (1) and under Condition (2). As is clear from FIG. 2, the process according to the present invention requires no additional cleaning step for 10 days' continuous operation, and the operation efficiency increases.

The process according to the present invention is not limited to the several modes as described hereinabove. In addition to an NiP-plated Al substrate which is typically used as a non-magnetic substrate, other substrates, such as a glass substrate or a silicon substrate, may be used. A substrate having a surface smoothness as high as 20 Å or less may also be used. In the present invention, a conventionally known CoCrTa alloy, CoCrPt alloy, CoCrPtTa alloy, or CoCoNiCr alloy, or such an alloy containing an additive element, may be used as a magnetic film.

The production process according to the present invention can remove carbon deposited on the inner walls of a chamber during formation of a carbon protective film, or carbon dust originating from peeled-off deposits. Thus, deterioration of glide characteristics, error characteristics, and anti-corrosion characteristics, which are qualities of a magnetic recording medium, is prevented.

The overall production yield increases due to a decrease in the number of defective products which must be removed.

In addition, the production process according to the present invention can reduce anomalous plasma discharge induced by carbon dust, and constant operation of a film-forming apparatus is ensured.

Furthermore, operation efficiency of the film-forming apparatus is increased, in that the steps of stopping operation of the chamber and opening the chamber in order to remove carbon deposits or carbon dust can be eliminated.

While the invention has been described in detail and with reference to specific embodiments thereof, it will be apparent to one skilled in the art that various changes and modifications can be made therein without departing from the spirit and scope thereof.

What is claimed is:

1. A production process for a magnetic recording medium comprising at least a non-magnetic substrate, a non-magnetic undercoat film, a magnetic film and a protective film predominantly comprising carbon, wherein the process comprises forming the protective film through a plasma CVD method in a CVD chamber employing a carbon-containing gas as a source, and applying an oxygen plasma discharge using an oxygen gas to induce conversion of carbon deposits on at least an inner wall of the chamber or carbon present in the chamber into gases, and further wherein the process comprises substituting any residual oxygen remaining after the conversion with a carbon-containing gas employed for forming the protective film after completion of the oxygen plasma discharge.

2. A production process according to claim 1, wherein a pressure in the chamber during the oxygen plasma discharge is about 3 Pa or more and less than or about 150 Pa.

3. A production process according to claim 1, wherein the residual oxygen in the chamber is forcedly exhausted simultaneously with the completion of the oxygen discharge.

4. A production process for a magnetic recording medium comprising at least a non-magnetic substrate, a non-magnetic undercoat film, a magnetic film and a protective film predominantly comprising carbon, wherein the process comprises forming the protective film through a plasma CVD method in a CVD chamber employing a carbon-containing gas as a source, and applying an oxygen plasma discharge using an oxygen gas to induce conversion of carbon deposits on at least an inner wall of the chamber or carbon present in the chamber into gases, further wherein the process comprises substituting any residual oxygen remaining after the conversion with a carbon-containing gas employed for forming the protective film after completion of the oxygen plasma discharge, and wherein an amount of the residual oxygen in the CVD chamber is decreased to a pressure of about $2.5 \times 10^{-3}$ Pa or less during a period of time after the completion of the oxygen plasma discharge and before forming another protective film.

5. A production process according to claim 4, wherein the residual oxygen in the chamber is forcedly exhausted simultaneously with the completion of the oxygen discharge.

6. A production process according to any one of claims 1, 3, 4 or 5, wherein the substituting of the carbon-containing gas for the residual oxygen in the chamber is carried out for about one second to about five seconds.

7. A production process according to any one of claims 1, 3, 4 or 5, further comprising stopping the oxygen gas before the completion of the oxygen plasma discharge, and maintaining the plasma discharge by a pressure of the residual oxygen in the chamber.

8. A production process according to claim 7, wherein the oxygen gas is stopped about 0.5 to about 2 seconds before the completion of the oxygen plasma discharge.

\* \* \* \* \*